United States Patent [19]

Papaliolios

[11] Patent Number: 5,198,706
[45] Date of Patent: Mar. 30, 1993

[54] FERROELECTRIC PROGRAMMING CELL FOR CONFIGURABLE LOGIC

[75] Inventor: Andreas G. Papaliolios, Sunnyvale, Calif.

[73] Assignee: National Semiconductor, Santa Clara, Calif.

[21] Appl. No.: 776,848

[22] Filed: Oct. 15, 1991

[51] Int. Cl.[5] .................. H03K 19/173; G11C 11/22
[52] U.S. Cl. .................... 307/465; 307/468; 365/145; 365/149
[58] Field of Search ............... 307/465, 468; 365/145, 365/147, 149, 228, 185, 190

[56] References Cited

U.S. PATENT DOCUMENTS

| | | | |
|---|---|---|---|
| 4,809,225 | 2/1989 | Dimmler et al. | 365/149 |
| 4,873,664 | 10/1989 | Eaton, Jr. | 365/145 |
| 4,974,204 | 11/1990 | Miller | 365/145 |
| 5,010,518 | 4/1991 | Toda | 365/145 |
| 5,086,412 | 2/1992 | Jaffe et al. | 365/145 |

Primary Examiner—David Hudspeth
Assistant Examiner—Andrew Sanders
Attorney, Agent, or Firm—Limbach & Limbach

[57] ABSTRACT

A ferroelectric programming cell utilizable for providing programming signals for configurable logic elements. A preferred embodiment of the ferroelectric programming cell includes a volatile memory cell having first and second internal data storage nodes that are latched in complementary states when the volatile memory cells positive power input is held to a maximum allowed voltage level and its negative power input is held at ground. A node enabling switching means connected between an external signal generator and the volatile memory cell enables an external signal generator to set the values of the first and second complementary internal nodes. First and second substantially identical capacitance-dividers each include a first ferroelectric capacitance means for storing a non-volatile configuration state. Each ferroelectric capacitance means has a driving terminal connected to the external signal generator and a measurement terminal connected to a second capacitance means that enables the volatile memory cell to measure the non-volatile configuration state of the first ferroelectric capacitance means. It also includes a measurement clearing switching means for enabling the external signal generator to force the voltage at the measurement terminal to ground. First and second substantially identical loading switches enable the external signal generator to transfer the nonvolatile configuration state stored in the first and second capacitance dividers to the internal nodes of the volatile memory cell.

4 Claims, 3 Drawing Sheets

FERROELECTRIC PROGRAMMING CELL FOR CONFIGURABLE LOGIC

BACKGROUND OF THE INVENTION

1. Field of the Invention

The present invention relates to semiconductor integrated circuits and, in particular, to ferroelectric circuits utilizable for programming configurable logic.

2. Discussion of the Prior Art

Configurable logic consists of a rectangular array of individually-programmable functional logic cells, each of which is connected to its neighbors by a programmable link. An open link means no connection; a closed link establishes a connection between cells. Thus, the configuration of the individual cells and of the links in the array determines the logic function to be performed by the circuit.

In some configurable logic arrays, such as PALs or PLAs, the links can only be programmed once. Thus, the system is permanently configured after programming. In other configurable logic arrays, such as that disclosed by Freeman, U.S. Pat. No. 4,870,302, the circuitry which stores the configuration data for the cell array is volatile, and the array needs to be reconfigured each time the chip is turned on.

In still other configurable logic array architectures, such as EEPROMs, configuring the array requires applying a high voltage which is distinct from the normal, operating supply voltage for a prolonged period of time in order to reconfigure the chip.

Additional examples of programmable logic devices and techniques are described in the following documents Furtek, U.S. Pat. No. 5,019,736, "Programmable Logic Cell and Array"; Furtek, U.S. Pat. No. 4,700,187, "Programmable Asynchronous Logic Cell and Array"; El Gamal, U.S. Pat. No. 4,873,459, "Programmable Interconnect Architecture"; Furtek, U.S. Pat. No. 4,918,440, "Programmable Logic Cell and Array"; and Austin, U.S. Pat. No. 4,935,734, "Semi-Conductor Integrated Circuits/Systems".

Due to recent developments in semiconductor technology, ferroelectric elements have become popular choices for implementing data storage devices. Ferroelectric devices rely on the polarization of domains in a PZT thin film structure to store information. Because polarization is maintained after the power is removed, while stored charge is not, and because they require little power and are quite compact, ferroelectric devices provide an excellent means for implementing a low power, nonvolatile memory circuit.

Ferroelectric storage circuits typically include one or more ferroelectric capacitors and various transistors utilized for appropriately charging and discharging the capacitors. A ferroelectric capacitor can be thought of as possessing a polarization which, as an approximation, arises from how it was last charged to its maximum value. In particular, assuming the capacitor consists of two plates N and S, one polarization occurs when the capacitor is charged to its maximum value with plate N at a higher voltage than plate S, and the other polarization occurs when the maximum charging occurs with plate S at a higher voltage than plate N. This polarization is maintained even if the voltage across the capacitor changes, provided that the voltage across the capacitor does not swing toward the maximum value in the opposite direction. In particular, the polarization is maintained even after power is removed from the device.

Because ferroelectric capacitors are compact and can be designed to have maximum voltages near the regular power supply voltage, they are good components for use in building non-volatile storage elements. The polarization of a ferroelectric capacitor can be detected electrically because the capacitance in one polarization state differs substantially from the capacitance in the other polarization state.

For simplicity in the discussion that follows, one of the polarization states is called "up" and the other polarization state is called "down"; it is assumed that the capacitance of the "up" polarization state is greater than that of the "down" polarization state.

A common method of using ferroelectric capacitors for building a memory element is disclosed in Eaton, Jr., U.S. Pat. No. 4,918,654 for "SRAM with Programmable Capacitance Divider". Eaton's memory element uses two ferroelectric capacitors. A "1" is stored by forcing the polarization of one capacitor into the "up" mode and the polarization of the other capacitor into the "down" mode. A "0" is stored by configuring the polarizations of the two capacitors in exactly the opposite manner. The stored value is read by charging each of the capacitors and comparing the resulting voltage. Because the polarizations differ, the capacitances differ, thus causing the voltages at each of the intermediate nodes to differ. In essence, the sign of this capacitance difference determines the stored value.

Other relevant examples of ferroelectric storage circuits include Dimmler, U.S. Pat. No. 4,809,225 for "Memory Cell with Volatile and Non-Volatile Portions Having Ferroelectric Capacitors" and Eaton, Jr., U.S. Pat. No. 4,914,627 for "One Transistor Memory Cell with Programmable Capacitance Divider".

In addition, Miller, U.S. Pat. No. 4,974,204 for "Non-Volatile Programmable Interconnection Circuit" discloses a programmable interconnection circuit that utilizes two ferroelectric capacitors that differentially store the programming state of the circuit. Although the Miller circuit provides a programming circuit having the advantages of ferroelectric data storage, it does not provide the cell isolation and capacitor equalization required for stable data retention.

SUMMARY

The present invention provides for programming configurable logic elements utilizing a distributed network of programming cells comprising ferroelectric capacitors and SRAM-like amplifiers. Each sense amplifier loads its configuration from the ferroelectric capacitors within 1 microsecond of power-up. The power-up cycle then writes data back to the ferroelectric capacitors to refresh them following the destructive read cycle. The two complementary outputs of the sense amplifier drive the inputs to a CMOS pass gate or other convenient logic element, setting the connectivity of the element. The sense amplifier is transparent, which makes the storing of new data simple. Externally, the device may be programmed just like an internal-SRAM configured integrated circuit.

Thus, a preferred embodiment of a ferroelectric programming cell in accordance with the present invention includes a volatile memory cell having first and second internal data storage nodes which are latched in complementary states when the volatile memory cell's positive power input is held to a maximum allowed voltage level and its negative power input is held at ground. A node enabling switching means connected between an external signal generator and the volatile memory cell enables the signal generator to set the values of the first and second complementary internal nodes. First and second substantially identical capacitance-dividers each include a first ferroelectric capacitance means for storing a non-volatile configuration state. Each ferroelectric capacitance means includes a driving terminal connected to the external signal generator and a measurement terminal connected to a second capacitance means that enables the volatile memory cell to measure the non-volatile configuration state of the first ferroelectric capacitance means. It also includes a measurement clearing switching means for enabling the external signal generator to force the voltage at the measurement terminal to ground. First and second substantially identical loading switches enable the external signal generator to transfer the non-volatile configuration state stored in the first and second capacitance dividers to their respective internal nodes of the volatile memory cell. The two internal nodes of the volatile memory cell are connectable to a pass gate which is coupled between first and second data terminals and is responsive to the configuration information stored at the internal nodes for either connecting the first and second data terminals or isolating the first and second data terminals.

The advantages of the invention are clear. Products that utilize conventional internal-SRAM-configurable field programmable arrays must load the configuration from software through the system bus, a time-consuming procedure. The alternative is to provide an on-board EPROM for quick power-up configuration. To up-date the EPROM product requires either that the system be disassembled for insertion of an up-dated EPROM or that the product include a built-in EE-PROM reprogrammer. Utilizing a non-volatile ferroelectric programming cell in accordance with the present invention provides instant auto-configure on power-up. Any changes, revisions or updates to the configuration data can be made without delay or disassembly by simply sending a new software configuration by modem, which can then be loaded into the product in-system. No additional chips are needed. The configurable device must simply be connected to the system bus.

A better understanding of the features and advantages of the present invention will be obtained by reference to the following detailed description of the invention and accompanying drawings which set forth an illustrative embodiment in which the principals of the invention are utilized.

DETAILED DESCRIPTION OF THE INVENTION

Figure 1:
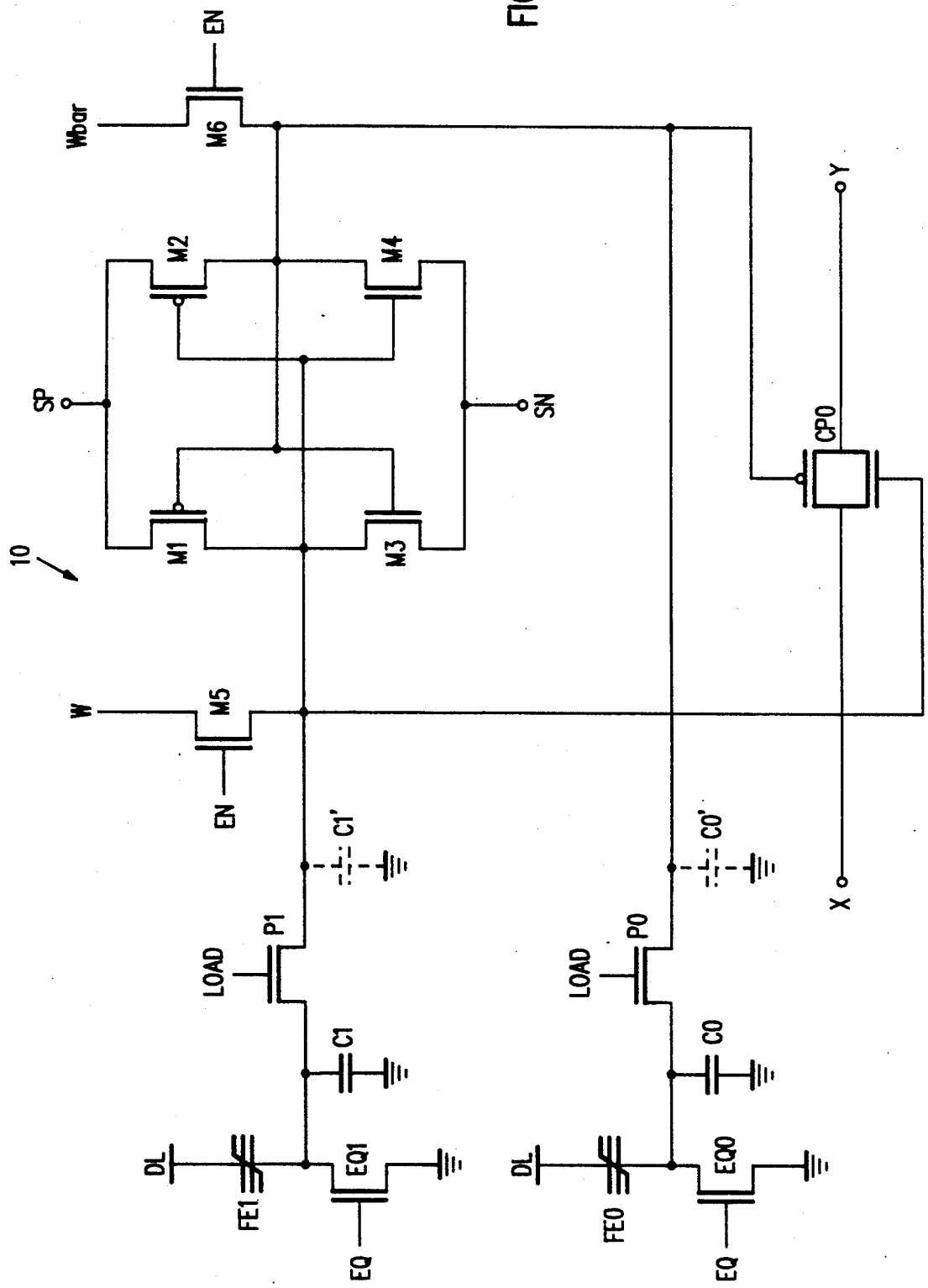
FIG. 1 is a schematic diagram illustrating a ferroelectric programming cell in accordance with the present invention.

FIG. 1 shows a ferroelectric programming cell 10 that includes ferroelectric capacitors FE1 and FE0 that store configuration data in the form of remnant polarization.

Four MOSFET devices M1, M2, M3 and M4 are configured to provide a conventional SRAM cell when signals SP and SN are held at Vdd and ground, respectively. FETs M1–M4 represent a sense amplifier; as described below, signals SP and SN are carefully controlled and timed to gently "pull apart" the signal differential, read from capacitors FE1 and FE0, into signal levels near Vdd and ground.

Sense capacitors C0 and C1, which can be either silicon capacitors or ferroelectric capacitors, are "bit-line" capacitances added in a Sawyer-Tower configuration to permit polling of capacitors FE1 and FE0 during read operations.

Pass gates P1 and P0 isolate the ferroelectric capacitors FE1 and FE0 when they are not being read or written.

Those skilled in the art will readily appreciate that, alternatively, the sense capacitors can be located on the SRAM side of pass gates P1 and P0, as shown by dashed-line capacitors C0' and C1' in FIG. 1.

Equalization gates EQ1 and EQ0 pull one plate of ferroelectric capacitor FE1 and FE0, respectively, to ground when the global signal EQ is pulsed. This operation increases reliability by assuring that remanent charge left on the plates of the ferroelectric capacitor does not lead to time dependent dielectric breakdown (TDDB).

Gate CP0, connectable between data terminals X and Y, is an example of a configuration gate which may be used to provide a desired configurable connection That is, the ferroelectric programming cell 10 includes a volatile memory cell M1–M4 that has a positive power input SP and a negative power input SN. The two internal data nodes of the cell M1–M4 are latched in complementary states when the positive power input SP is held to a maximum allowed voltage level and the negative power input SN is held at ground. Conversely, the two data nodes are not latched when the positive power input SP is held at ground and the negative power input SN is held at the maximum allowed voltage level.

Two node enabling switches M5, M6 respectively connected to the two data nodes of the cell 10 enable an external signal generator to set the values of the data nodes.

A configuration cell CP0 having two data terminals X, Y and two complimentary control inputs respectively connected to the two data nodes of the cell 10, cause the two data terminals to be connected when the control inputs are set in one state and to be isolated when the control signals are set to the opposite state.

Two capacitance-dividers each include a ferroelectric capacitor (FE0, FE1) for storing a non-volatile configuration state and both a driving terminal DL connected to the external signal generator and a measurement terminal connected to a second capacitor (C0, C1). This arrangement enables the volatile memory cell M1–M4 to measure the non-volatile configuration state of the ferroelectric capacitor. Measurement clearing switches (P0, P1) enable the external signal generator to force the voltage at the measurement terminals to ground and to connect the ferroelectric capacitors (FE0, FE1) to ground.

If the capacitance of the ferroelectric capacitor FE0 in the "up" polarization is a first value C1up1 and is a second value C1down1 in the "down" polarization, and if the capacitance of the second ferroelectric capacitor FE1 in the "up" polarization is a third value C2up1 and is a fourth value C2down1 in the "down" polarization, and if the capacitance of the second capacitor C0 associated with the first ferroelectric capacitor FE0 is a fifth value C1 and the capacitance of the second capacitor associated with the second ferroelectric capacitor FE1 is a sixth value C2, then the following relationships apply:

$$C1up1*C2 > C2down1*C1$$

and $$C1down1*C2 < C2up1*C1.$$

Two substantially identical loading switches (P0, P1) enable the connected external generator to transfer the non-volatile configuration state stored in the capacitance dividers to the volatile memory cell 10 by connecting the capacitance divider's measurement terminal to one of the cell's data nodes.

Figure 2:
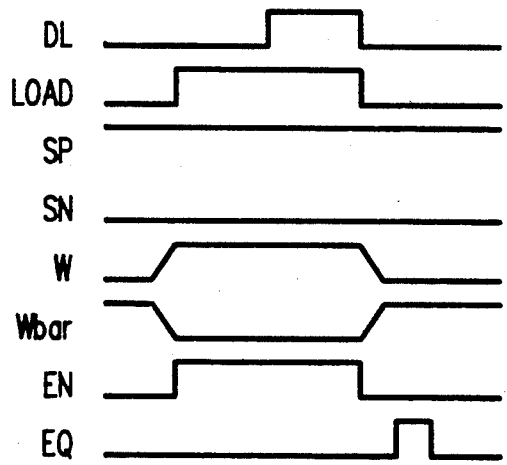
FIG. 2 is a timing diagram illustrating waveforms associated with the storing configuration of the FIG. 1 cell.
Figure 3:
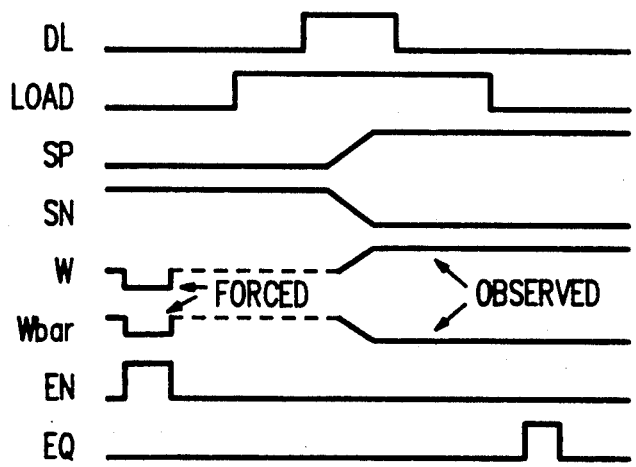
FIG. 3 is a timing diagram illustrating waveforms associated with the power-up retrieve and restore mode of the FIG. 1 cell.

As further shown in FIG. 1, and in the FIGS. 2 and 3 timing diagrams, each cell 10 requires ten signals. Signals SP and SN are global signals used by the SRAM cell (FETS M1–M4) to sense the incoming signal from the ferroelectric storage elements FEI and FE0 and to hold the sense state while power is supplied to the circuit. The LOAD signal controls pass gates P1 and P0 to isolate the ferroelectric elements FE1 and FE0 from disturbing signals when they are not being accessed. Signal EQ is pulsed after a ferroelectric access cycle to set the floating node on one of each of the ferroelectric plates to ground, thereby enabling the voltage at the measurement terminal of each ferroelectric capacitor FE0, FE1 to be forced to ground. Signal DL is the global drive line which pulses one plate of each of the ferroelectric storage elements FE1 and FE0 during read and write operations. Signals W and Wbar are the two incoming data signals. Signals W and Wbar are gated into the cell 10 by enable signal EN. When enable signal EN is asserted, the state of the cell 10 can also be read by measuring the W and Wbar signals.

To store data into the cell 10, appropriate values for input signals W and Wbar are set. The particular configuration cell is selected by driving the LOAD signal and the enable signal EN high while holding global signal DL low. A period greater than 50 ns after the LOAD and EN signals are driven high (which writes the "0" state to the appropriate ferroelectric element), signal DL is pulled to Vdd for greater than 50 ns. This action writes the "1" state to the other ferroelectric storage element. As soon as inputs W and Wbar are set, and the enable signal EN is asserted, the configuration of the SRAM cell is automatically stored and held. No read back is necessary as long as drive is sufficient to flip the cross-coupled latch. To conserve routing space, complementary signals are not necessary; either the W or Wbar signal may be used without the other.

To load the programming cell 10 on power up, signals SP and SN are first set to ground and Vdd, respectively. To precharge the sense amplifiers, all enable lines are pulsed high for about 20 ns with all W and Wbar lines held at ground. When Vdd is greater than 4.5 volts, and all sense amplifiers have been precharged, the load signal LOAD is asserted. A brief time later, approximately 20 ns, signal DL is pulsed high. Signals DL and LOAD are held high while signals SP and SN are evenly pulled to Vdd and ground, respectively. This action sets the state of the SRAM cell and writes back a "0" to the appropriate ferroelectric element. Signal DL is then pulled low, which writes back a "1" to the other ferroelectric element.

Figure 4:
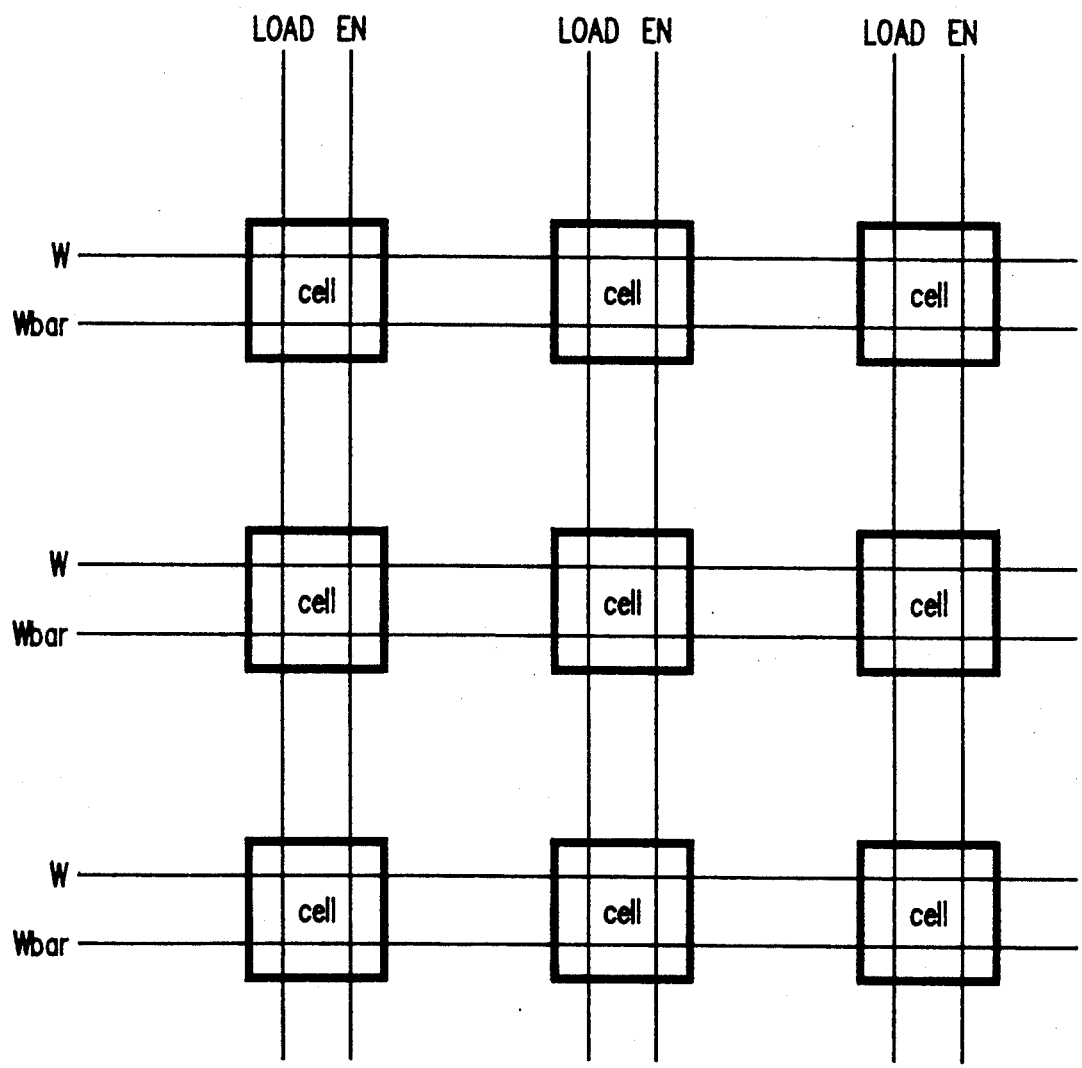
FIG. 4 illustrates utilization of the FIG. 1 cell in an X-Y array.

The programming cell 10 may be utilized many instances throughout a particular configurable integrated circuit. FIG. 4 shows the utilization of the configurable cell 10 in an X-Y array. Each cell 10 in the FIG. 4 array may be accessed individually for writing new data by forcing voltage onto the appropriate W and Wbar lines and asserting the appropriate LOAD and EN signals. For cells not accessed, the LOAD and EN signal should be low or W and Wbar are floated. Writing to one cell 10 automatically refreshes all data stored in other cells sharing the same LOAD signals.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A ferroelectric programming cell, the cell comprising:
   (a) a volatile memory cell having a positive power input and a negative power input and first and second internal nodes which are latched in complementary states when the positive power input is held to a maximum allowed voltage level and the negative power input is held at ground, and are not latched when the positive power input is held at ground and the negative power input is held at the maximum allowed voltage level;
   (b) a node enabling switching means connected to the volatile memory cell for enabling an external signal generator to set the values of the first and second internal nodes;
   (c) a configuration cell having two data terminals and first and second complementary control inputs respectively connected to the first and second internal nodes for causing the two data terminals to be connected when the control inputs are set in one state and the data terminals to be isolated when the control inputs are set to the opposite state;
   (d) first and second substantially identical capacitance-dividers, each including a first ferroelectric capacitance means for storing a non-volatile configuration state, with a driving terminal connected to the external signal generator and a measurement terminal connected to a second capacitance means that enables the volatile memory cell to measure the non-volatile configuration state of the first ferroelectric capacitance means, and a measurement clearing switching means for enabling the external signal generator to force the voltage at the measurement terminal to ground and connected to the first ferroelectric capacitance measurement terminal and to ground;
   (e) first and second substantially identical loading switching means for enabling the connected external signal generator to transfer the non-volatile configuration state stored in the first and second capacitance dividers to the volatile memory cell, each loading switching means connecting the measurement terminal within a corresponding capacitance divider to one of the complementary internal nodes of the volatile memory cell;

each internal node of the volatile memory cell being connected respectively to one of the complementary control inputs of the configuration cell.

2. A ferroelectric programming cell as in claim 1 wherein all the switching means are matched CMOS transistors.

3. The ferroelectric programming cell as in claim 1 wherein the second capacitance means comprises a ferroelectric capacitor.

4. A ferroelectric programming cell, said cell comprising:

(a) a volatile memory cell having a positive power input and a negative power input and first and second internal nodes which are latched in complementary states when the positive power input is held to a maximum allowed voltage level and the negative power input is held at ground, and are not latched when the positive power input is held at ground and the negative power input is held at the maximum allowed voltage level;

(b) node enabling switching means connected to the volatile memory cell for enabling an external signal generator to set the values of the first and second internal nodes;

(c) a configuration cell having two data terminals and first and second complementary control inputs respectively connected to the first and second internal nodes, said configuration cell causing the two data terminals to be connected when the control inputs are set in one state and the data inputs to be isolated when each control inputs are set to the opposite state;

(d) first and second capacitance-dividers each including a first ferroelectric capacitance means for storing a non-volatile configuration state using a storing a non-volatile configuration state using a ferroelectric capacitor, and having a driving terminal and a measurement terminal, the driving terminal connected to the external signal generator and the measurement terminal connected to a second capacitance means for enabling the volatile memory cell to measure the non-volatile configuration state of the first ferroelectric capacitance means connected to the first ferroelectric capacitance means measurement terminal, and a measurement clearing switching means for enabling the external signal generator to force the voltage at the measurement terminal to ground and connected to the first ferroelectric capacitance measurement terminal and to, ground and wherein the capacitance of the first capacitance-divider's first ferroelectric capacitance means in the "up" polarization is a first value C1up1 and is a second value C1down1 in the "down" polarization, and where in the capacitance of the second capacitance-divider's first ferroelectric capacitance means in the "up" polarization is a third value C2up1 and is a fourth value C2down1 in the "down" polarization and wherein the capacitance of the first capacitance divider's second capacitance means is a fifth value C1 and the capacitance of the second capacitance divider's second capacitance means is a sixth value C2, and wherein C1up1*C2 > C2down1*C1 and wherein C1down*C2 > C2up1*C1; and (e) two substantially identical loading switching means for enabling the connected external signal generator to transfer the nonvolatile configuration state stored in the capacitance dividers to the volatile memory cell, connecting the measurement terminal within a capacitance divider to one of the complementary internal nodes of the volatile memory cell;

each internal node of the volatile memory cell being connected respectively to one of the complementary control inputs of the configuration cell.

* * * * *

UNITED STATES PATENT AND TRADEMARK OFFICE
CERTIFICATE OF CORRECTION

PATENT NO. : 5,198,706
DATED : March 30, 1993
INVENTOR(S): Andreas Grant Papaliolios It is certified that error appears in the above - identified patent and that said Letters Patent is hereby corrected as shown below:

In Col. 7, lines 40-41, delete "using a storing a non-volatile configuration state";

In Col. 8, line 29, delete " $>$ " and replace with -- $<$ --.

Signed and Sealed this

Twenty-fifth Day of January, 1994

Attest:

BRUCE LEHMAN

Attesting Officer

Commissioner of Patents and Trademarks